United States Patent [19]

Nakahigashi et al.

[11] Patent Number: 5,651,825
[45] Date of Patent: Jul. 29, 1997

[54] PLASMA GENERATING APPARATUS AND PLASMA PROCESSING APPARATUS

[75] Inventors: Takahiro Nakahigashi; Hajime Kuwahara, both of Kyoto, Japan

[73] Assignee: Nissin Electric Co., Ltd., Kyoto, Japan

[21] Appl. No.: 396,779

[22] Filed: Mar. 1, 1995

[30] Foreign Application Priority Data

Mar. 2, 1994 [JP] Japan .................... 6-032494

[51] Int. Cl.$^6$ .................... C23C 16/00
[52] U.S. Cl. .................... 118/723 ME; 118/723 MW
[58] Field of Search ............ 118/723 E, 723 MP, 118/723 MW, 723 ME, 723 MR; 156/345; 204/298.38

[56] References Cited

U.S. PATENT DOCUMENTS

| | | | |
|---|---|---|---|
| 4,876,983 | 10/1989 | Fukuda et al. | 118/722 |
| 5,021,114 | 6/1991 | Saito et al. | 156/345 |
| 5,081,398 | 1/1992 | Asmussen et al. | 315/111.41 |
| 5,162,633 | 11/1992 | Sonobe et al. | 219/121.43 |
| 5,206,471 | 4/1993 | Smith . | |
| 5,211,825 | 5/1993 | Saito et al. | 204/192.32 |
| 5,284,544 | 2/1994 | Mizutani et al. | 156/345 |
| 5,292,370 | 3/1994 | Tsai et al. | 118/723 MP |
| 5,359,177 | 10/1994 | Taki et al. | 219/121.43 |
| 5,368,685 | 11/1994 | Kumihashi et al. | 156/643 |
| 5,462,635 | 10/1995 | Ono et al. | 216/67 |

FOREIGN PATENT DOCUMENTS

| | | |
|---|---|---|
| 383 567 A2 | 8/1990 | European Pat. Off. . |
| 383 567 A3 | 8/1990 | European Pat. Off. . |

OTHER PUBLICATIONS

"Special Series on Irradiation Enhanced Adhesion," Vacuum, vol. 38, No. 2, pp. 73–81, 1988, Rossnagel et al.

Sugiyama, Kazuo and Tsutsumi, Kazuyoshi and Matsuda, Tsuneo, "Nitrogen monoixade decomposition by microwave argon plasma at atomosheric pressure", Denki Kagaku oyobi Kogyo Butsuri Kagaku, abstract, 1992.

Primary Examiner—John Niebling
Assistant Examiner—Joni Y. Chang
Attorney, Agent, or Firm—Nikaido Marmelstein Murray & Oram LLP

[57] ABSTRACT

A plasma material gas is introduced into a plasma producing chamber, and, if necessary, a processing gas is introduced into a processing chamber communicated with the plasma producing chamber. In the plasma producing chamber, a microwave is radiated to a sintered body of metal oxide forming a plasma source, so that plasma is generated from the plasma material gas. Ions generated thereby are accelerated and introduced into the processing chamber. Predetermined processing is performed on a work directly by the ions, or is performed in a plasma generated by the ions from the processing gas.

15 Claims, 2 Drawing Sheets

PLASMA GENERATING APPARATUS AND PLASMA PROCESSING APPARATUS

BACKGROUND OF THE INVENTION

1. Field of the Invention

The present invention relates to a plasma generating apparatus and a plasma processing apparatus provided with the same, and more particularly to a plasma generating apparatus used for plasma CVD, plasma etching and other plasma processing, and a plasma processing apparatus provided with the same. The plasma CVD is performed for depositing a film on a substrate in a process of producing various kinds of sensors provided with semiconductors and other devices utilizing semiconductors as well as solar cells and others. The plasma etching is performed, e.g., for etching a deposited film in accordance with a predetermined pattern so as to form interconnection patterns or the like. The plasma generating apparatus is also used for the plasma processing which is performed, e.g., for improving quality of a surface of a substrate with plasma.

2. Description of the Background Art

In general, plasma of a high density which is required in the plasma processing is generated by such a method that an excitation gas is changed into plasma by thermoelectrons emitted by heating a filament, and a processing gas is excited by ions in the plasma to form plasma.

An example of an apparatus used for such plasma processing will be described below in connection with a plasma processing apparatus shown in FIG. 2. This apparatus includes a plasma producing chamber 1 and a processing chamber 2 which are communicated with each other and are grounded.

A filament 3 forming a plasma source is disposed in the plasma producing chamber 1. The filament 3 is connected to a DC power supply 4. An ion leading electrode 5 is disposed under the filament 3. A DC power supply 6 is connected between the electrode 5 and a substrate holder 10 which will be described later. The plasma producing chamber 1 is connected to a gas supply 7 for an excitation gas via a piping. The gas supply 7 includes one or more gas sources 731, 732, ... for excitation gases connected to pipings provided with mass-flow controllers 711, 712, ... and valves 721, 722, ..., respectively. Around the plasma producing chamber 1, there is disposed a ring-shaped solenoid magnet 8 for converging the generated ions toward the processing chamber 2.

The substrate holder 10 is disposed in the lower portion of the processing chamber 2, and is provided with a heater 10a for heating a substrate S2 mounted on the holder 10 to a processing temperature. When the substrate S2 is to be heated by radiant heat, the heater 10a is spaced from the holder 10. If required, a cooler may be used instead of the heater 10a.

The holder 10 is connected to an rf (radio-frequency) power supply 12 via a matching box 11, or is connected to a DC power supply 13 or 14. A selector switch 15 is operable to select the power supply 13 or 14. If the substrate S2 mounted on the holder 10 is electrically conductive, a DC voltage is applied from the DC power supply 13 or 14 to control the incident plasma for controlling the processing rate. If the substrate S2 is an electrical insulator, an rf voltage is applied by the rf power supply 12 to control the incident plasma for controlling the processing rate.

Above the holder 10, there is disposed a ring-shaped gas injection pipe 16, which is provided at its lower surface portion faced to the holder 10 with a large number of gas nozzles. The gas injection pipe 16 is connected to a gas supply 18 for a plasma processing gas via a gas introduction pipe 17. The gas supply 18 includes one or more gas sources 183a, 183b, ... for the plasma processing gas via mass-flow controllers 181a, 181b, ... and valves 182a, 182b, ..., respectively. The excitation gas supply 7 and the plasma processing gas supply 18 are connected to the chambers 1 and 2 via different pipings for the following reason. If these gases were mixed together, particles forming dust are likely to be generated, and thus would contaminate the surface of the substrate S2 and interiors of the chambers 1 and 2. A ring-shaped solenoid magnet 9 is disposed along the outer peripheral wall of the processing chamber 2, and an exhausting device 19 is connected to the processing chamber 2. The solenoid magnet 9 is provided for converging ions toward the substrate S2 on the holder 10.

According to this plasma processing apparatus, the substrate S2 is held on the substrate holder 10, and then the exhausting device 19 is operated to set the chambers 1 and 2 to a predetermined degree of vacuum. Then, the excitation gas is introduced into the plasma producing chamber 1 from the gas supply 7, and the DC power is applied from the power supply 4 to the filament 3. Thereby, thermoelectrons are emitted from the heated filament 3, so that the plasma is generated from the introduced excitation gas. The ions in the plasma are accelerated and moved into the processing chamber 2 by the ion leading electrode 5, to which a voltage is applied from the DC power supply 6.

Meanwhile, the plasma processing gas is introduced to the vicinity of the substrate S2 via the gas introduction pipe 17 and the gas injection pipe 16 from the gas supply 18. The ions supplied from the plasma producing chamber 1 are converged toward the substrate S2 owing to the magnetic field formed by the solenoid magnet 9. The plasma processing gas introduced to the vicinity of the substrate 2 is excited by the ions to form the plasma, so that intended plasma processing is performed on the surface of the substrate S2. By this processing, etching is performed if the plasma processing gas is a gas for etching. If it is a gas for deposition, a film is deposited. If it is a gas for improving the quality of the surface, the quality of the substrate surface is improved.

In this plasma process, however, the filament 3 is liable to break if the pressure in the chambers 1 and 2 is high. Therefore, the pressure in the chambers to be maintained at a high degree of vacuum cannot be higher than $1 \times 10^{-4}$ Torr. This increase a cost as compared with that for the plasma processing at a normal pressure. If the substrate to be processed is made of a material such as plastics which is likely to vaporize at a lower pressure, it is difficult to increase the degree of vacuum.

Even in the plasma processing at a high degree of vacuum of the pressure not higher than $1 \times 10^{-4}$ Torr, if an inert gas or the like is used as a major gas of the excitation gas, and a gas containing an oxygen ($O_2$) gas is additionally contained in the excitation gas for generating oxygen (O) plasma, the filament 3 breaks when the processing is performed for about ten hours in total even if a content of the oxygen gas is low and not higher than 10%.

The filament is generally made of metal having a high melting point such as tungsten (W). Similarly to the case where the oxygen gas is used as the excitation gas, if the excitation gas contains, for example, oxygen or halogen, metal of the filament forms oxide or halide and this compound vaporizes, so that the filament is consumed and a life-time thereof decreases. Further, the vaporized metal oxide or metal halide adheres, as impurity, onto the surface of the substrate and/or the interior of the vacuum container, and contaminates them.

SUMMARY OF THE INVENTION

Accordingly, it is a first object of the invention to provide a plasma generating apparatus which can be used for the plasma processing of the work to be processed, and particularly to provided a plasma generating apparatus in which plasma can be generated at a low degree of vacuum or a normal pressure. Also, the apparatus can be stably used for a long time by reducing consumption of a plasma source, even if a plasma material gas used for the excitation contains an active gas containing, e.g., oxygen or halogen, provided that a content of the active gas is not higher than a predetermined small value. Further, the plasma generating apparatus can suppress production of impurity owing to reduction of the consumed plasma source, and thus can suppress contamination of the interior of the plasma producing chamber.

A second object of the invention is to provide a plasma processing apparatus having a plasma generating apparatus and a processing chamber for accommodating a work to be processed, which is in communication with the plasma generating apparatus. Particularly, the second object is to provide the plasma processing apparatus which can perform the plasma processing on the work even at a low degree of vacuum or a normal pressure, and can be stably used for a long time by reducing consumption of a plasma source, even if a plasma material gas used for the excitation contains an active gas containing, e.g., oxygen or halogen, provided that a content of the active gas is not higher than a predetermined small value. Further, the plasma processing apparatus can suppress production of impurity owing to reduction of the consumption of the plasma source, and thus can suppress contamination of the plasma generating apparatus, various interior portions of the processing chamber and the work during predetermined plasma processing of the work.

The inventors have studied for achieving the aforementioned objects and found as follows. Instead of the conventional filament made of metal having a high melting point such as tungsten, a plasma source made of a sintered body of metal oxide is used, an excitation gas is introduced to the vicinity of the plasma source, and a microwave is radiated to the plasma source. Thereby, plasma is generated from the gas, and this generation of plasma can be performed not only at a high degree of vacuum but also at a low degree of vacuum and a normal pressure. Further, even if the excitation gas contains a small amount of an active gas containing oxygen, halogen or the like, consumption of the plasma source is suppressed. The invention has been developed based on this finding.

Thus, the invention provides the following plasma generating apparatuses as well as plasma processing apparatuses provided with the same.

A plasma generating apparatus according to the invention, achieving the above-noted first object, includes a plasma producing chamber, means for supplying a plasma material gas containing an inert gas at 90% or more to the plasma producing chamber, a plasma source mounted in the plasma producing chamber and made of a sintered body of metal oxide, and means for radiating a microwave to the plasma source.

A plasma processing apparatus according to the invention, achieving the above-noted second object, includes the above plasma generating apparatus, a processing chamber communicated with the plasma generating apparatus and provided with means for supporting a work to be processed, and means for accelerating and introducing ions in the plasma generated by the plasma generating apparatus into the processing chamber.

The metal oxide used in the plasma generating apparatus and the plasma processing apparatus according to the invention may be, for example, $La_{(1-x)}Sr_xCoO_3$, $Y_1Ba_2Cu_3O_x$ or $Bi_2Sr_2Ca_2Cu_3O_x$. One or more of them can be used.

The metal oxide may have a specific resistance not higher than $10^3 \Omega \cdot cm$. If the specific resistance is higher than $10^3 \Omega \cdot cm$, a microwave current cannot flow sufficiently, and thus plasma cannot be generated sufficiently.

In the plasma generating apparatus and the plasma processing apparatus according to the invention, the plasma material gas introduced into the plasma producing chamber may contain an inert gas such as a helium (He) gas, neon (Ne) gas, argon (Ar) gas, krypton (Kr) or xenon (Xe) gas at 90% or more, and in other words, may contain an active gas such as a gas containing oxygen or halogen at 10% or less. The reason for this is that, if the content of active gas exceeds 10%, the density of produced plasma unpreferably decreases. Naturally, the gas may consist of an inert gas without containing an active gas. The active gas my be an oxygen containing gas such as an oxygen gas, nitrogen monoxide (NO) gas or nitrous oxide ($N_2O$) gas, or a halogen containing gas such as a fluorine ($F_2$) gas or chlorine ($Cl_2$) gas.

The plasma generating apparatus according to the invention may be provided with exhausting means for setting the plasma producing chamber to a predetermined vacuum state in order to control the plasma. Also the plasma processing apparatus according to the invention may be provided with exhausting means for setting the plasma producing chamber and processing chamber to a predetermined vacuum state in order to control the plasma and processing of the work. In this case, the exhausting means may be independently provided for each of the plasma producing chamber and the processing chamber, or may be provided commonly for them.

A plasma processing apparatus according to the invention may be provided with means for supplying the processing gas to the processing chamber accommodating a work to be processed in order to allow predetermined processing with the processing gas. The means for introducing the processing gas may be a piping device for introducing the gas to the vicinity of the work, and for example, may be a ring-shaped gas injection pipe in the conventional apparatus shown in FIG. 2.

Similarly to the conventional apparatus, the plasma generating apparatus and the plasma processing apparatus according to the invention may be provided with a magnet, for example, having a ring-like form around the plasma producing chamber for converging ions generated in the plasma producing chamber toward the processing chamber, and/or may be provided with a magnet, for example, having a ring-like form around the processing chamber for converging the ions toward the work.

In the plasma processing apparatus according to the invention, the means for accelerating and introducing the ions in the plasma generated in the plasma producing chamber to the processing chamber may include the ion leading electrode, for example, as shown in FIG. 2. In this case, there may be provided with means for applying a DC voltage across the ion leading electrode and means for supporting the work in the processing chamber.

In the plasma processing apparatus according to the invention, a DC power supply and/or an rf power supply for applying a voltage may be connected to the means for supporting the work in the processing chamber in order to control incident plasma and thus control a processing rate of the work.

In the plasma generating apparatus according to the invention, the plasma material gas is introduced into the plasma producing chamber, and a microwave is radiated to the plasma source by the microwave radiating means, so that the plasma is generated from the gas. The mechanism of this may be that the metal oxide of the plasma source subjected to the microwave functions as catalyst and achieves the proximity effect promoting generation of the plasma from the plasma material gas.

Production of the plasma can be performed not only in a high vacuum state at a pressure not exceeding $1 \times 10^{-4}$ Torr but also in a low vacuum state at a pressure exceeding $1 \times 10^{-4}$ Torr and a normal pressure state.

The plasma material gas may contain an active gas such as a gas containing oxygen or halogen. Such active gas is likely to react on high melting-point metal such as tungsten to produce metal oxide or metal halide in the prior art. In this case, the sintered body of metal oxide hardly reacts on such active gas, so that consumption of the plasma source is suppressed if the content of active gas in the material gas is not higher than 10%.

According to the plasma processing apparatus of the invention, the ions in the plasma thus produced are accelerated and introduced into the processing chamber accommodating the work, and the ions act to perform predetermined processing such as ion injection or etching on the work.

If the processing chamber is provided with means for supplying the processing gas, the ions accelerated and introduced into the processing chamber generate the plasma from the processing gas, and predetermined processing is performed on the work in the plasma. More specifically, etching is performed if the plasma processing gas is an etching gas, film deposition is performed if it is a deposition gas, and improvement of quality of the surface of the work is performed if it is a gas for improving quality of surface.

Since consumption of the plasma source is suppressed as already described, impurity caused by the plasma source is suppressed from adhering onto the surface of the work as well as various portions of the plasma producing chamber and the processing chamber.

If the DC power supply is connected to the work supporting means in the processing chamber, the DC voltage may be applied to the supporting means for controlling the incident plasma to control the processing rate, provided that the work is electrically conductive.

If the rf power supply is connected to the work supporting means in the processing chamber, the rf voltage may be applied to the supporting means for controlling the incident plasma to control the processing rate, provided that the work supported by the supporting means is an electrical insulator.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
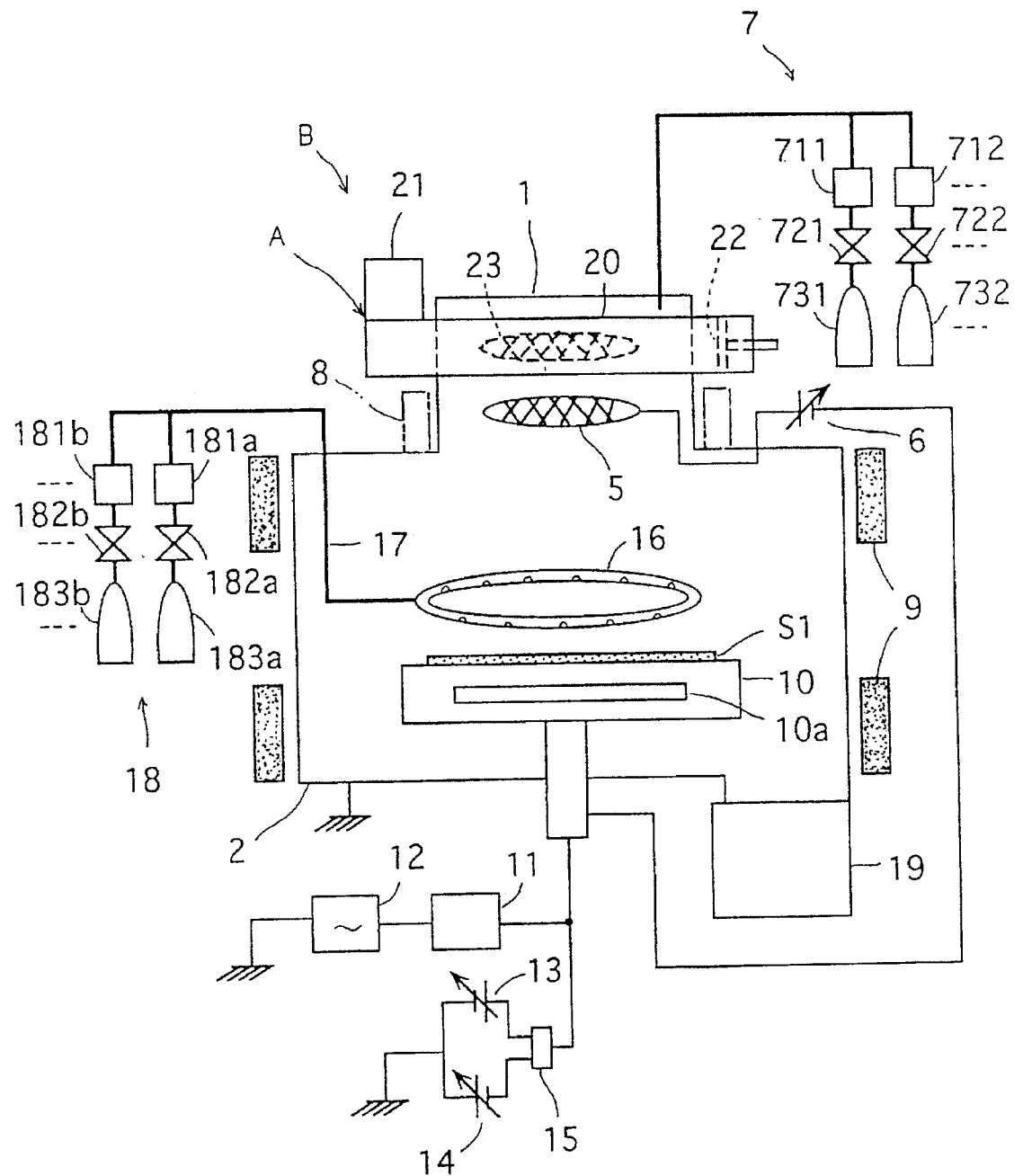
FIG. 1 shows a schematic structure of an example of a plasma processing apparatus according to the invention.

A plasma processing apparatus B shown in FIG. 1 utilizes a plasma generating apparatus A according to the invention. The apparatus B differs from the conventional apparatus shown in FIG. 2 in that the apparatus B is not provided with the DC power supply 4 and the filament 3 in the conventional apparatus shown in FIG. 2, but is provided with a ring-shaped cavity 20 fitted around a plasma producing chamber 1, a microwave power supply 21 connected to the cavity 20, and a tuner 22 for changing the capacity of the cavity 20, and that a mesh-like plasma source 23 made of a sintered body of metal oxide is arranged in the chamber 1. Structures other than the above are the same as those shown in FIG. 2. The same parts and portions as those in FIG. 2 bear the same reference numbers.

The purpose of provision of the mesh-like plasma source 23 is to increase a contact area between the source 23 and the plasma material gas supplied from the plasma material gas supply 7 by passing the gas therethrough during generation of the plasma. The plasma producing chamber 1, plasma material gas supply 7, cavity 20, microwave power supply 21 and plasma source 23 form the plasma generating apparatus A.

Although the illustrated embodiment is not provided with a magnet around the chamber 1, the same magnet 8 as that in the conventional apparatus may be disposed as indicated by broken line in FIG. 1.

The plasma processing apparatus B described above performs the plasma processing as follows.

First, a substrate S1, which is a kind of a work to be processed, is mounted on the substrate holder 10, and then, the exhausting device 19 is operated, if necessary, to set the chambers 1 and 2 to a predetermined degree of vacuum. Subsequently, the gas supply 7 supplies the excitation gas, i.e., plasma material gas, into the plasma producing chamber 1, and the microwave power is applied to the cavity 20 from the microwave power supply 21, and then supplied to the plasma source 23. Matching for the microwave radiation is performed by changing the capacity of the cavity 20 by the tuner 22. In this manner, the plasma is generated from the supplied excitation gas.

Ions in the plasma are accelerated and moved toward the substrate holder 10 owing to the potential difference, which is formed between the ion leading electrode 5 and the substrate holder 10 by the application of a voltage from the DC power supply 6 to the electrode 5. At the same time, plasma processing gas is introduced to the vicinity of the substrate S1 from the gas supply 18 via the gas introduction pipe 17 and the gas injection pipe 16. The ions supplied from the plasma producing chamber 1 are converged toward the substrate S1 owing to the magnetic field generated by the solenoid magnet 9. The ions thus converged excite the plasma processing gas introduced to the vicinity of the substrate S1 to form the plasma, so that intended plasma processing is effected on the surface of the substrate S1.

When the plasma processing gas is not introduced from the gas supply 18, the surface of the substrate S1 is processed in an intended manner by the ions converged at a position above the substrate S1.

In the processing of the substrate S1, if desired or required, the power supply 12, 13 or 14 appropriately applies an AC voltage or a DC voltage to the holder 10, whereby the processing rate is controlled.

In accordance with the manner described above, intended plasma processing can be effected on the surface of the substrate S1 even if the chambers 1 and 2 are set to a low vacuum state at a pressure exceeding $1\times10^{-4}$ Torr or a normal pressure state. Even if the excitation gas is formed of a gas containing an active gas which contains, e.g., oxygen or halogen, it is possible to reduce consumption of the plasma source 23, provided that the content of the active gas in the excitation gas is not higher than 10%, and thus it is possible to suppress adhesion of impurity onto the surface of the substrate S1 as well as various portions of the chambers 1 and 2.

Although not shown in the figure, the processing gas supply 18 may be eliminated if ions or the like generated by the plasma generating apparatus A are used for performing etching or other direct processing on the work with the ions or the like.

Specific examples in connection with a plasma CVD apparatus formed of the apparatus shown in FIG. 1 will be described below.

EXAMPLE 1

Formation of Amorphous Silicon Film

| Substrate: | 6-inch silicon (Si) wafer |
|---|---|
| Apparatus Conditions | |
| Plasma Source Material: | $La_{(1-x)}Sr_xCoO_3$ sintered at 1373° K. Specific resistance $1 \times 10^{-4}$ $\Omega \cdot cm$ |
| Plasma Source Size: | 100 mm (diameter) × 3 mm (thickness) Mesh size #20–60 |
| Size of Plasma Producing Chamber: | 100 mm (dia.) × 150 mm |
| Deposition Conditions | |
| Microwave Power: | 250 W |
| Deposition Vacuum Pressure: | 1 Torr |
| Magnetic Field Intensity: | 100 Gauss |
| Excitation Gas (Plasma Material Gas): | Argon (Ar) gas 1200 sccm |
| Deposition Material Gas: | Monosilane ($SiH_4$) gas 100 sccm |
| Substrate Temperature: | 200° C. |
| Incident Plasma Control: | by power supply 14, −20 V |
| Deposition Result | |
| Film Thickness: | 2000 Å |
| Deposition Rate: | 600 Å/min |
| Thickness Uniformity: | ±5% |

A content of impurity in the deposited amorphous silicon film was measured by the SIMS analysis method. The content was lower than a detectable limit. Similar processing was repetitively performed on new substrates. Even after the processing for 1000 hours in total, the processing caused no problem relating to the deposition with respect to consumption of the plasma source 23.

EXAMPLE 2

Formation of Amorphous Silicon Film

This differs from the example 1 in that the excitation gas was formed of an Ar gas (1200 sccm, 99.8%) and a nitrogen monoxide (NO) gas (2.4 sccm, 0.2%). Other conditions were the same as those in the example 1. An amorphous silicon film was deposited on the silicon substrate S1.

Deposition Result

Film Thickness: 2000 Å

Deposition Rate: 580 Å/min

Thickness Uniformity: ±4%

A content of impurity in the deposited amorphous silicon film was measured by the SIMS analysis method. The content was lower than a detectable limit. Similar processing was repetitively performed on new substrates. Even after the processing for 1000 hours in total, the processing caused no problem relating to the deposition with respect to consumption of the plasma source 23.

Example 1 for Comparison

Formation of Amorphous Silicon Film

Figure 2:
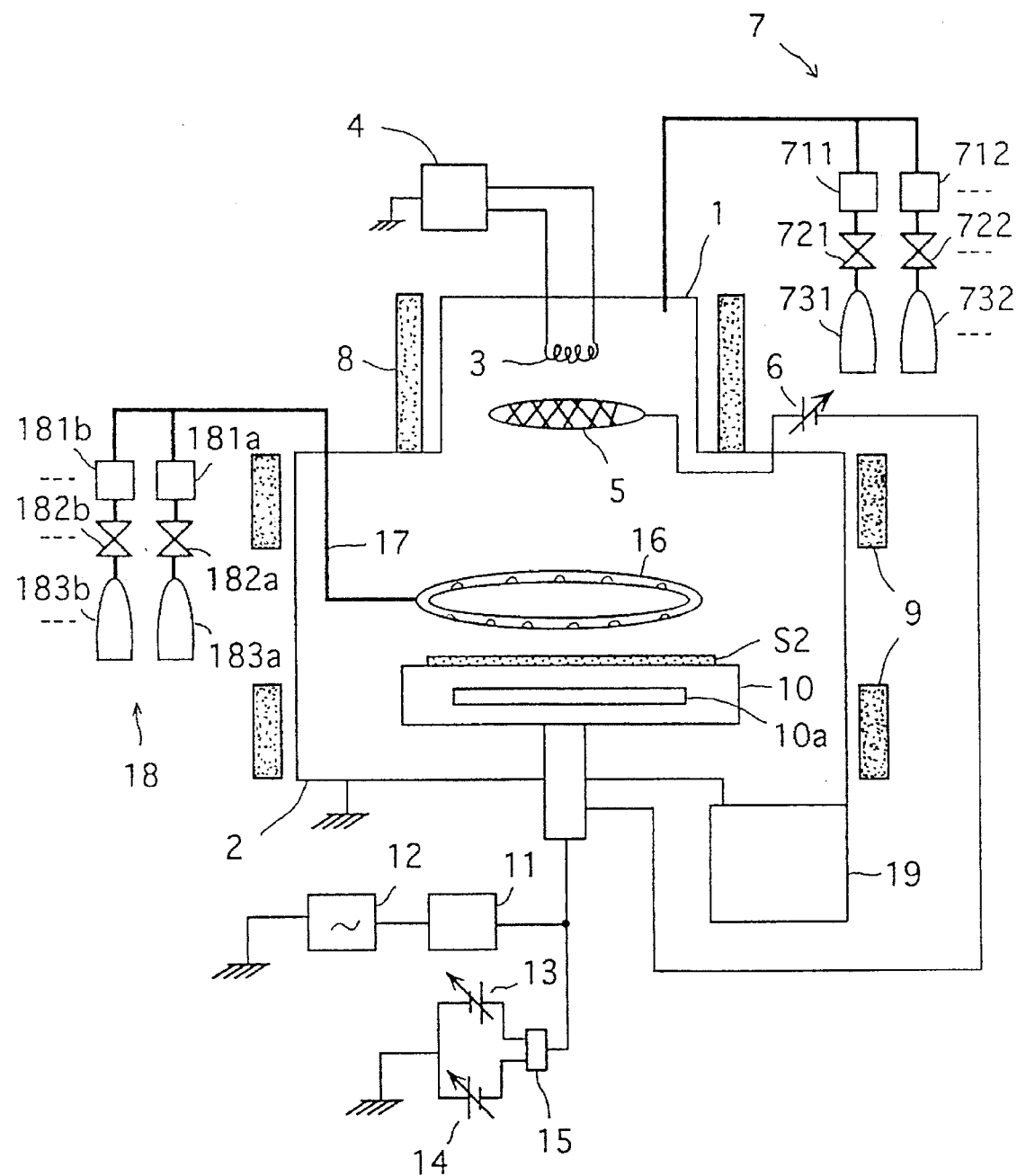
FIG. 2 shows a schematic structure of a conventional example of a plasma processing apparatus.

An amorphous silicon film was deposited on the substrate with the conventional plasma processing apparatus shown in FIG. 2 instead of the apparatus shown in FIG. 1. The same conditions as those in the example 2 were employed in connection with the substrate, magnetic field intensity by the magnet 9, excitation gas, deposition material gas, substrate temperature and incident plasma control condition. The deposition vacuum pressure was set to $1\times10^{-4}$ Torr. The filament 3 made of tungsten was used, and the plasma was generated from the excitation gas by applying a DC power of 1.0 kW to the filament. The intensity of the magnet 8 was 50 Gauss.

Deposition Result

Film Thickness: 100 Å

Deposition Rate: 10 Å/min

Thickness Uniformity: ±20%

A content of impurity in the deposited amorphous silicon film was measured by the SIMS analysis method. It was detected that the film contained tungsten atoms at the density of $4\times10^{21}$ atoms/$cm^3$, which were probably generated from the filament 3. Similar processing was repetitively performed on new substrates. The filament broke when the processing was performed for about 1 hour in total.

According to the deposition of examples 1 and 2, the deposition rate is about 60 times as large as that in the deposition of the example 1 for comparison, and thus it can be understood that an extremely high plasma density was obtained. The thickness uniformity of the examples 1 and 2 was four or five times as large as that of the example 1 for comparison. According to the deposition of the example 2, the excitation gas contained the nitrogen monoxide gas at 0.2%. In spite of this fact, the plasma source 23 of the example 2 could achieve the life-time exceeding 1000 hours similarly to the deposition of the example 1 using the excitation gas containing only the argon gas. The plasma source 23 used in the examples 1 and 2 has the life-time which is 1000 times or more as long as that of the filament 3 used in the example 1 for comparison. Further, the content of impurity mixed into the film is lower than the detectable limit of the SIMS analysis method in contrast to the amorphous silicon film in the example 1 for comparison.

The deposition of the examples 1 and 2 could be performed in a low vacuum state at a pressure exceeding $1\times10^{-4}$ Torr.

Then, specific examples of the apparatus in FIG. 1 used as an etching apparatus will be described below.

EXAMPLE 3

Etching of Aluminum (Al) Film

Substrate: 6-inch silicon (Si) wafer provided at its surface with an aluminum film of 1 μm in thickness

| Apparatus Conditions | |
|---|---|
| Plasma Source Material: | $La_{(1-x)}Sr_xCoO_3$ sintered at 1373° K. Specific resistance $1 \times 10^{-4}$ $\Omega \cdot cm$ |
| Plasma Source Size: | 100 mm (diameter) × 3 mm (thickness) Mesh size #20–60 |

-continued

| | |
|---|---|
| Size of Plasma Producing Chamber: | 100 mm (dia.) × 150 mm |
| Etching Conditions | |
| Etching Vacuum Pressure: | $5 \times 10^{-2}$ Torr |
| Microwave Power: | 250 W |
| Magnetic Field Intensity: | 100 Gauss |
| Excitation Gas (Plasma Material Gas): | Argon (Ar) gas 1000 sccm |
| Etching Gas: | Chlorine ($Cl_2$) gas 100 sccm |
| Substrate Temperature: | 200° C. |
| Incident Plasma Control: | by power supply 14, −400 V |
| Etching Result | |
| Etching Rate: | 4000 Å/min |
| Etching Uniformity of Etched Surface: | ±5% |
| Etched Shape: | Forward Taper |

Similar processing was repetitively performed on new substrates. Even after the processing for 1000 hours in total, the processing caused no problem relating to the etching with respect to consumption of the plasma source 23.

Example 2 for Comparison
Etching of Aluminum Film

An aluminum film formed on the substrate was etched with the conventional plasma processing apparatus shown in FIG. 2 instead of the apparatus shown in FIG. 1. The same conditions as those in the example 3 were employed in connection with the substrate, magnetic field intensity of the magnet 9, excitation gas, etching gas, substrate temperature and incident plasma control condition. The etching vacuum pressure was set to $1 \times 10^{-4}$ Torr. The filament 3 made of tungsten was used, and the plasma was generated from the excitation gas by applying a DC power of 1.5 kW to the filament. The intensity of the magnet 8 was 50 Gauss.

Etching Result

Etching Rate: 1000 Å/min

Etching Uniformity of Etched Surface: ±10%

Etched Shape: Reverse Taper

Similar processing was repetitively performed on new substrates. The filament broke when the processing was performed for about 5 hours in total.

According to the example 3, the etching rate is about four times as large as that in the etching of the example 2 for comparison, and thus it can be understood that a high plasma density was obtained. The etching uniformity of etched surface of the example 3 was improved as compared with that of the example 2 for comparison. In connection with the etched shape, the example 3 could achieve the forward taper in contrast to the reverse taper of the example 2 for comparison, and thus could perform anisotropic etching.

The etching of the example 3 could be performed in a low vacuum state at a pressure exceeding $1 \times 10^{-4}$ Torr.

EXAMPLE 4

Etching of Aluminum Film

This differs from the example 3 in that the excitation gas was formed of an argon gas (1000 sccm, about 91%) and a chlorine gas (100 sccm, about 9%), and that the etching gas was not supplied from the gas supply 18. Other conditions were the same as those in the example 3. The aluminum film was etched.

Etching Result

Etching Rate: 5000 Å/min

Etching Uniformity of Etched Surface: ±6%

Etched Shape: Forward Taper

Similar processing was repetitively performed on new substrates. Even after the processing for about 2000 hours in total, the processing caused no problem relating to the etching with respect to consumption of the plasma source 23.

Example 3 for Comparison
Etching of Aluminum Film

An aluminum film formed on the substrate was etched with the conventional plasma processing apparatus shown in FIG. 2 instead of the apparatus shown in FIG. 1. The same conditions as those in the example 4 were employed in connection with the substrate, magnetic field intensity of the magnet 9, excitation gas, substrate temperature and incident plasma control condition. The etching vacuum pressure was set to $1 \times 10^{-4}$ Torr. The filament 3 made of tungsten was used, and the plasma is generated from the excitation gas by applying a DC power of 1.5 kW to the filament. The intensity of the magnet 8 was 50 Gauss.

Etching Result

Etching Rate: 2000 Å/min

Etching Uniformity of Etched Surface: ±10%

Etched Shape: Reverse Taper

Similar processing was repetitively performed on new substrates. The filament broke when the processing was performed for about 5 hours in total.

The example 4 can achieve the etching rate larger than that in the etching of the example 3 for comparison, and thus it can be understood that a high plasma density was obtained. The etching uniformity of etched surface of the example 4 was improved as compared with that of the example 3 for comparison. In connection with the etched shape, the example 4 could achieve the forward taper in contrast to the reverse taper of the example 3 for comparison, and thus could perform anisotropic etching. In spite of the fact that the excitation gas contained about 9% chlorine gas, the life-time of the plasma source 23 was 400 times or more as long as that of the filament 3 used in the example 3 for comparison.

The etching of the example 4 could be performed in a low vaccum state at a pressure exceeding $1 \times 10^{-4}$ Torr.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma generating apparatus comprising:
   a plasma producing chamber having an integrally formed ring-shaped cavity expanding a width of said plasma producing chamber in a portion thereof;
   means for supplying a plasma material gas to said plasma producing chamber;
   a tuner, provided in said ring-shaped cavity, for changing a capacity of said ring-shaped cavity;
   a plasma source mounted in said plasma producing chamber, said plasma source being a mesh-like sintered body of metal oxide; and
   means for radiating a microwave to said plasma source, said means connected to said ring-shaped cavity.

2. A plasma generating apparatus according to claim 1, wherein said metal oxide is at least one kind of compound selected from a group including $La_{(1-x)}Sr_xCoO_3$, $Y_1Ba_2Cu_3O_x$ and $Bi_2Sr_2Ca_2Cu_3O_x$.

3. A plasma generating apparatus according to claim 1, wherein said metal oxide is a compound having a specific resistance not higher than $10^3 \Omega \cdot cm$.

4. A plasma generating apparatus according to claim 1, further comprising exhausting means for setting said plasma producing chamber to a vacuum state.

5. A plasma processing apparatus comprising:

a plasma generating apparatus including a plasma producing chamber having an integrally formed ring-shaped cavity expanding a width of said plasma producing chamber in a portion thereof, means for supplying a plasma material gas to said plasma producing chamber, a tuner, provided in said ring-shaped cavity, for changing a capacity of said ring-shaped cavity, a plasma source mounted in said plasma producing chamber, said plasma source being a mesh-like sintered body of metal oxide, and radiating means for radiating a microwave to said plasma source, said radiating means connected to said ring-shaped cavity;

a processing chamber communicated with said plasma generating apparatus and provided with work supporting means for supporting a work to be processed; and means for accelerating and introducing ions in said plasma generated by said plasma generating apparatus into said processing chamber.

6. A plasma processing apparatus according to claim 5; wherein said means for accelerating and introducing ions in said plasma generated by said plasma generating apparatus into said processing chamber includes an ion leading electrode.

7. A plasma processing apparatus according to claim 5, wherein said metal oxide is at least one kind of compound selected from a group including $La_{(1-x)}Sr_xCoO_3$, $Y_1Ba_2Cu_3O_x$ and $Bi_2Sr_2Ca_2Cu_3O_x$.

8. A plasma processing apparatus according to claim 5, wherein said metal oxide is a compound having a specific resistance not higher than $10^3 \Omega \cdot cm$.

9. A plasma processing apparatus according to claim 5, further comprising processing gas supplying means for supplying a processing gas into said processing chamber.

10. A plasma processing apparatus according to claim 5, further comprising a magnet disposed around said plasma producing chamber for converging the ions generated in said plasma producing chamber toward said processing chamber.

11. A plasma processing apparatus according to claim 5, further comprising a magnet disposed around said processing chamber for converging said ions introduced from said plasma producing chamber toward said work supported by said work supporting means.

12. A plasma processing apparatus according to claim 5, wherein a power supply for applying a voltage for controlling the incident plasma is connected to said work supporting means in said processing chamber.

13. A plasma processing apparatus according to claim 5, further comprising exhausting means for setting said plasma producing chamber and said processing chamber to a vacuum state.

14. A plasma processing apparatus according to claim 9, wherein said processing apparatus deposites a film on said work.

15. A plasma processing apparatus according to claim 9, wherein said processing apparatus etches said work.

* * * * *